United States Patent [19]

Corbett et al.

[11] Patent Number: 4,951,221

[45] Date of Patent: Aug. 21, 1990

[54] CELL STACK FOR VARIABLE DIGIT WIDTH SERIAL ARCHITECTURE

[75] Inventors: Peter F. Corbett, Princeton, N.J.; Richard I. Hartley, Schenectady, N.Y.

[73] Assignee: General Electric Company, Schenectady, N.Y.

[21] Appl. No.: 182,602

[22] Filed: Apr. 18, 1988

[51] Int. Cl.$^5$ ............................ G06F 1/00; G06F 7/50
[52] U.S. Cl. ..................................... 364/489; 364/488
[58] Field of Search ................................ 364/488–491, 364/900 MS File, 200 MS File, 200; 357/40, 75

[56] References Cited

U.S. PATENT DOCUMENTS

| 4,584,653 | 4/1986 | Chih et al. | 364/488 X |
| 4,621,339 | 11/1986 | Wagner et al. | 364/489 |
| 4,701,860 | 10/1987 | Mader | 364/490 |
| 4,739,474 | 4/1988 | Holsztynski | 364/200 |
| 4,791,590 | 12/1988 | Ku et al. | 364/726 |

OTHER PUBLICATIONS

VLSI Signal Processing: A Bit-Serial Approach, P. Denyer & D. Renshaw, Chap. 2, "A Silicon Compiler", pp. 29–56, Addison-Wesley Pub. Co., 1985, Reading, MA.
"Custom Design of a VLSI PCM-FDM Transplexer from System Specification to Circuit Layout Using a Computer-Aided Design System", IEEE Journal of Solid State Circuits, vol. SC-21, No. 1, 1986, Feb., pp. 73–85.
"A Silicon Compiler for Digital Signal Processing: Methodology, Implementation & Application", Proc. of IEEE, vol. 75, No. 9, Sept. 1987, pp. 1272–1282.
"Digit-Piplined Arithmetic as Illustrated by the Paste-Up System: A Tutorial", Computer, Apr. 1987, pp. 61–73.
"Techniques to Increase the Computational Throughput of Bit-Serial Architectures", Proceeding of ICASSP 87, pp. 543–546, Apr. 1987.
"Radix-4 Modules for Bit-Serial Computation", IEE Proceedings, vol. 134, No. 6, Nov. 1987, pp. 271–276.
Serial Data Computation, S. G. Smith & P. B. Denyer, copyright 1988, Kluwer Academic Publishers, Boston MA, pp. 140–149.

Primary Examiner—Gareth D. Shaw
Assistant Examiner—Paul Kulik
Attorney, Agent, or Firm—Allen L. Limberg; James C. Davis, Jr.; Marvin Snyder

[57] ABSTRACT

A design methodology for digit serial architecture, especially for use in digital signal processing circuitry, includes a cell stack configuration incorporating a variable number of individual operation cells in conjunction with cap and control cells to provide power, control and timing signals. The arrangement employed permits the construction of cell libraries for silicon compilers from a small number of individual components and permits such compilers to generate chip fabrication masks for a plurality of fixed, but initially arbitrary digit size circuit designs.

16 Claims, 6 Drawing Sheets

CELL STACK FOR VARIABLE DIGIT WIDTH SERIAL ARCHITECTURE

BACKGROUND OF THE INVENTION

The present invention is generally directed to a cell stack architecture which is particularly useful for constructing variable digit width electronic circuits for digital signal processing. More particularly, the present invention is directed to a cell stack architecture which allows the construction of a number of basic cell stacks from libraries of computational circuit elements so as to permit a number of cell stacks to be easily assembled to carry out digit serial operations for any digit size within reasonable bounds. Cell stack arrays fabricated from the corresponding cell stack library are used to address a wide range of digital signal processing applications.

A proper understanding of the present invention can only be had through an understanding of bit serial and digit serial digital signal processing (DSP) architecture. In bit serial computation, data streams arrive at various computational elements a single bit at a time rather than all at once as in a fully parallel architecture. Bit serial architectures generate a single bit of output in each fundamental clock cycle. The advantage of bit serial architecture is that it is very simple to implement and to design and consumes very little "chip real estate" in integrated circuit devices. Bit serial architectures have often been perceived as having a disadvantage not only of a long latency time, but also the disadvantage of a low throughput even after the pipeline delay latency period has elapsed.

The present applicants have discerned that in any given digital signal processing problem, optimal results in terms of throughput and chip real estate actually require an architecture which draws both upon serial and upon parallel computational philosophies. To this end, applicants have proven that, in general, optimal design requires the utilization of digit serial architectural circuit designs. In these designs, bits are grouped together in digits having 2, 3, 4, 5, 6 or more bits and these "parallel" digits are processed in a serial fashion. Thus, in digit serial architecture, a data word is divided into a number of digits of fixed, but initially arbitrary width. Arithmetic data flow within the circuit is over digit-wide signal lines and is propagated with the least significant digit first. Thus, data arrives serially at each operator, one digit at a time. Arithmetic and logic operators perform digit-serial calculations on this data and provide digit-serial output. In order to exploit this architecture fully, it is necessary to accommodate arbitrary digit widths up to some reasonable maximum, say NMAX. Typically, NMAX is 12 or 16 but is not limited thereto. It is noted though that once an optimal digit width is determined for a particular signal processing system which is to be implemented on one or more integrated circuit chips, the digit width is fixed for circuit components appearing on that chip.

In the design of circuit chips to carry out digital serial processing applications, it has become very desirable to employ combinations of hardware and software generally referred to as "silicon compilers". In general, the role of a silicon compiler is to accept from an operator specified signal processing functions and to produce from these specifications a plurality of integrated circuit masks which, when employed in the proper sequence and in accordance with accepted integrated circuit processing methodologies, produce an electronic integrated circuit chip implementing the specified signal processing function in a given semiconductor technology and architecture. The architecture of relevance herein is the serial architecture and, much more particularly, the digit serial architecture. Silicon compilers exist which permit the operator to specify the signal processing function in terms of a high level algebraic equation which is received by the silicon compiler and operated on thereby to produce the mask-set which will operate to generate an electronic integrated circuit chip which implements the specified high level algebraic function.

In order to carry out these objectives, it is necessary for silicon compilers to have available to them a library of cells which are capable of carrying out operations on data which is as wide as the desired digit size. In order to make it possible for silicon compilers to carry out these objectives, the library of basic cells which are required to implement these digit serial operations, cannot be too large. Accordingly, the present invention is directed to a schema of cell stack construction which is achieved by stacking bit slices to generate operators for any digit size. More particularly, the present invention is directed to the formation of a cell library for a silicon compiler which permits that compiler to construct digit serial operators for any reasonable digit size specified by the operator.

As indicated above, throughput and chip size limitations can in fact be optimized by an operator selecting an appropriate digit size. However, it should be noted that while the present invention is particularly directed to the construction of cell libraries for silicon compilers, applicants' invention is also directed to the cell stacks themselves that are generated from the masks produced by silicon compilers and the like which employ the design criteria disclosed herein.

It is noted that serial computation per se is not a new idea. Bit serial design has been studied, especially as a vehicle for the automatic generation of chips using silicon compilers. Such compilers include the FIRST compiler discussed in the text "VLSI Signal Processing: A Bit-Serial Approach" published by the Addison-Wesley Publishing Company, Inc. of Reading, Massachusetts, 1985. CATHEDRAL is another such silicon compiler and is described, for example, in the article titled "Custom Design of a VLSI PCM-FDM Transmultiplexer from System Specification to Circuit Layout Using a Computer-Aided Design System" as appearing in the *IEEE Journal of Solid State Circuits,* Volume SC-21, No. 1, February 1986 on pages 73-85. Another silicon compiler is described by one of the inventors herein and others in the article "A Silicon Compiler for Digital Signal Processing: Methodology, Implementation and Applications" appearing in the *Proceedings of the IEE Special Issue on Hardware and Software for Digital Signal Processing,* Volume 75, No. 9, September 1987, on pages 1272-1282.

Attempts have also been made to improve upon the bit serial design approach. For example, Irwin and Owens describe a modified bit serial approach in their article titled "Digit-Pipelined Arithmetic as Illustrated by the Paste-Up System: A Tutorial" appearing in *Computer,* April 1987 on pages 61-73. Another modified bit serial approach is described in the article by S. G. Smith et al. titled "Techniques to Increase the Computational Throughput of Bit-Serial Architectures" appearing in the *Proceedings of ICASSP* 87 on page 543 thereof (April 1987). Yet another modification of the bit serial approach is described by S. G. Smith and P. B. Denyer in an article titled "Radix-4 Modules for Bit-Serial Computation", *IEE Proceedings*, Vol. 134, Pt. E, No. 6., Nov. 1987, pages 271–276. Serial computational methods are also described by Smith and Denyer in their book "Serial-Data Computation" copyright 1988 by Kluwer Academic Publishers, Boston MA, pages 140–149. Thus it has generally. Thus, it has generally been recognized that the drawback of bit serial computation is its relatively low throughput. However, purely parallel computational methodologies, while allowing high throughput, are very expensive in chip area. The compromise of using a digit serial architecture has been mentioned occasionally in the works indicated above. Most particularly, the work of Denyer and Smith considers two-bit-wide data paths. Another approach which uses two-bit-wide serial data paths is discussed by Irwin and Owens in their article cited above. Their approach, however, is to use the most significant digit first redundant data representation. This makes their computational elements fundamentally different from other serial computational approaches. The most significant digit first design philosophy does not lend itself readily to bit slicing and it is therefore not clear that their design architecture could be successfully extended to higher digit widths. Thus, it seems that efforts being currently expended in the serial computational area are directed at the situation of two bit wide data paths and does not address the general problem. However, it is extremely desirable to be able easily to vary the digit width so as thereby to examine the tradeoff between space usage and throughput for a number of different digit widths. Furthermore theoretical and experimental data have shown that the most efficient usage of chip area is generally achieved for higher digit widths in the range of from 4 to 8. This is an optimal situation which has heretofore not been appreciated in the serial computation arts.

SUMMARY OF THE INVENTION

In accordance with a preferred embodiment of the present invention, a cell stack for digit serial digital circuit systems comprises a cap cell, a plurality of operation cells capable of carrying out single bit serial operations and a control cell. The cap cell, operation cells and the control cell are arranged in a vertical stack in which each cell is of approximately the same width so as to define a width for the overall cell stack. The cap cell is configured to provide power from one side of a power supply to the operation cells and to the control cell and to provide a means for supplying power to adjacently disposed cell stacks from one side of a power supply. The control cell is configured to provide power from a second side of the power supply to the operation cells and to provide a means for supplying power to adjacently disposed cell stacks. In preferred embodiments of the present invention, the control cell contains control circuitry and is operable to receive at least one timing and/or control signal to control the operations carried out by the operation cells. The cell stack height is essentially constant for any specified digit size. Cell stacks may be configured to perform such operations as digit serial addition, subtraction, complementation and various logical operations. The cell stacks are readily connectable in an array which possesses the same height as the individual cell stacks. Arrays of cell stacks are constructed to carry out operations such as digit serial multiplication. The cell stacks of the present invention are readily implementable in terms of a variety of semiconductor technologies and offer a significant advantage of design flexibility and layout efficiency.

Accordingly, it is an object of the present invention to provide a cell library for a silicon compiler.

It is another object of the present invention to facilitate the design of digit serial computational systems.

It is still another object of the present invention to produce efficient digital signal processing circuits in the sense that these circuits consume a small amount of area on an integrated circuit chip device.

It is yet another object of the present invention to allow a small number of operator cells and stacks of cells to be designed which may be arranged together to form libraries of arithmetic and logical operations.

It is a still further object of the present invention to permit the design of digital signal processing circuits with any desired digit size.

It is also an object of the present invention to permit the design of digital signal processing circuits which exhibit an optimal digit width.

It is yet another object of the present invention to increase the throughput from serial digital architectures.

Lastly, but not limited hereto, it is an object of the present invention to facilitate the design of serial operators for use on integrated circuit devices.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
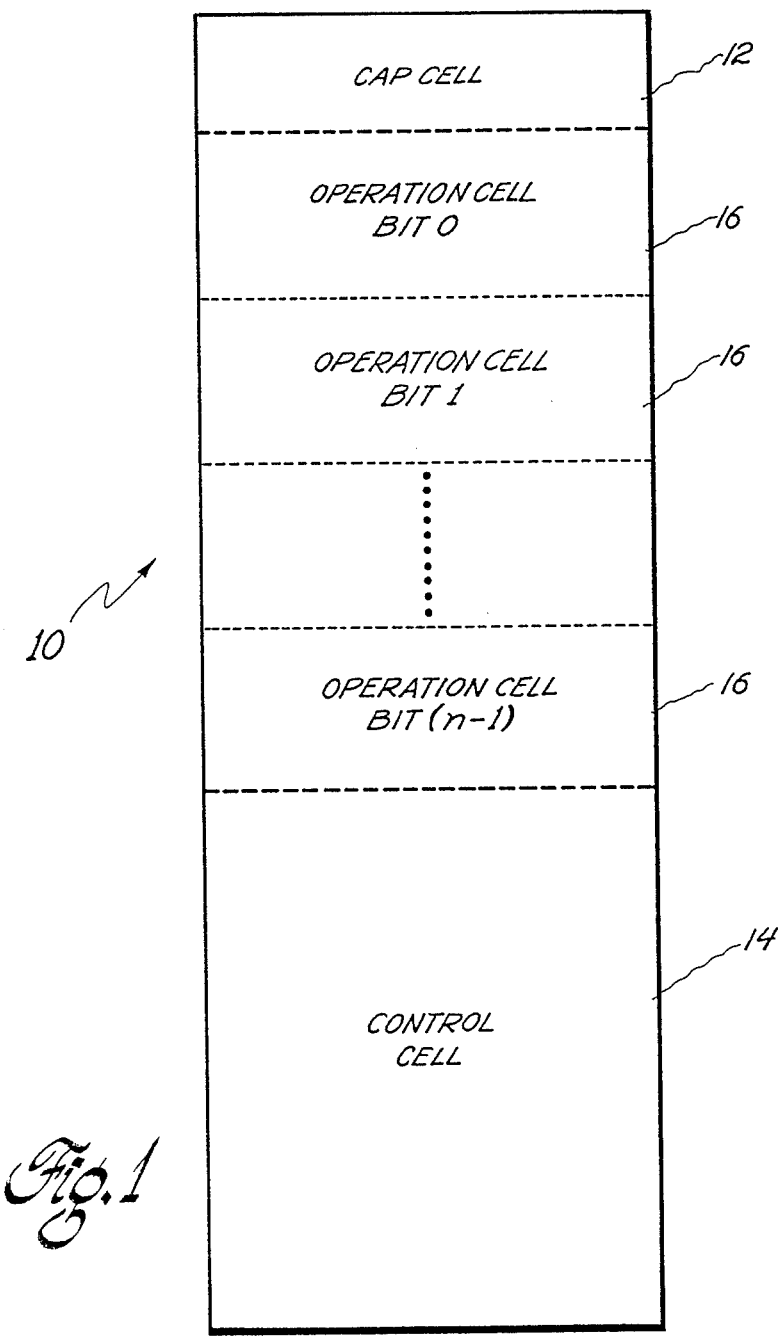
FIG. 1 is a block diagram illustrating the layout for a basic cell stack template in accordance with the present invention.

FIG. 1 illustrates, in block diagram form, one embodiment of a cell stack structure in accordance with the present invention. In particular, cell stack 10 is seen to comprise a cap cell 12 disposed at the top of a vertical stack of cells. At the bottom of the vertical stack there is present a control cell 14. Between cap cell 12 and control cell 14 there are disposed a plurality, n, of operation cells 16. The number of operation cells is seen to be dependent upon the selected digit size. Each of the operation cells 16 is operable to carry out one or more single bit operations. Cap cell 12, operation cells 16 and control cell 14 are arranged in a vertical stack in which each cell is approximately the same width. Cap cell 12 is employed to carry the VSS power bus and may be used to make minor routing connections. Control cell 14 carries the VDD power bus. These power busses are typically the different polarity power conductors from a power connection which is made to the chip which cell stack 10 is incorporated. The cap cell 12 and the control cell 14 are preferably configured so as be capable of providing continuous conductive paths connecting adjacently disposed cell stacks so that adjacently disposed cell stacks are connected to the desired power supply conductors. Control cell 14 typically carries out tasks such as delaying and resetting carry signals, buffering and inverting clock signals and performs any other necessary logic control. The function of each control cell generally varies from cell stack to cell stack.

For all cell stacks which conform to the basic template shown in FIG. 1, the height of these stacks is constant. Thus, if A and B are two such cell stacks, the control cell for stacks A and B are equal in height. Similarly, the bit slices (operation cell areas) of stacks A and B are equal in height as are the cap cells. The width of the cell stacks may be different for different cell stack functions. As a result of this structure, the total cell stack height of all n bit digit serial operators is the same. The height of a cell stack is given by the following formula:

$$\text{total\_height} = \text{cap\_height} + \text{control\_height} + (n \times \text{slice\_height}) \quad (1)$$

Furthermore, power and clock signals, preferably being at standard locations in the control and cap cells provide matched connections between adjacently disposed cell stacks. Because of this, cell stacks may be placed side by side in rows of cell stacks of equal height. However, it is also possible to provide a small routing path between adjacently disposed cell stacks. This is desirable so that cells may be placed and routed with efficient standard cell place-and-route methods.

While FIG. 1 shows cap cells disposed at the top of a vertical stack and control cells disposed at the bottom of this same stack, it is noted that this is not the only possible arrangement of these three different types of cells within a stack. However, it is the preferred embodiment. It is, however, noted that it would be readily possible to interchange the placement of the control cells and cap cells without significantly affecting the practice of the present invention. Similar objectives could also be obtained simply be disposing the stack cells shown in FIG. 1 in an inverted position. However, in this case, the general signal flow path from one side of the stack to the other is reversed. In fact, this reversal may provide advantages in overall chip layout in which an overall signal flowpath is provided on a chip in a zigzag fashion.

Figure 2:
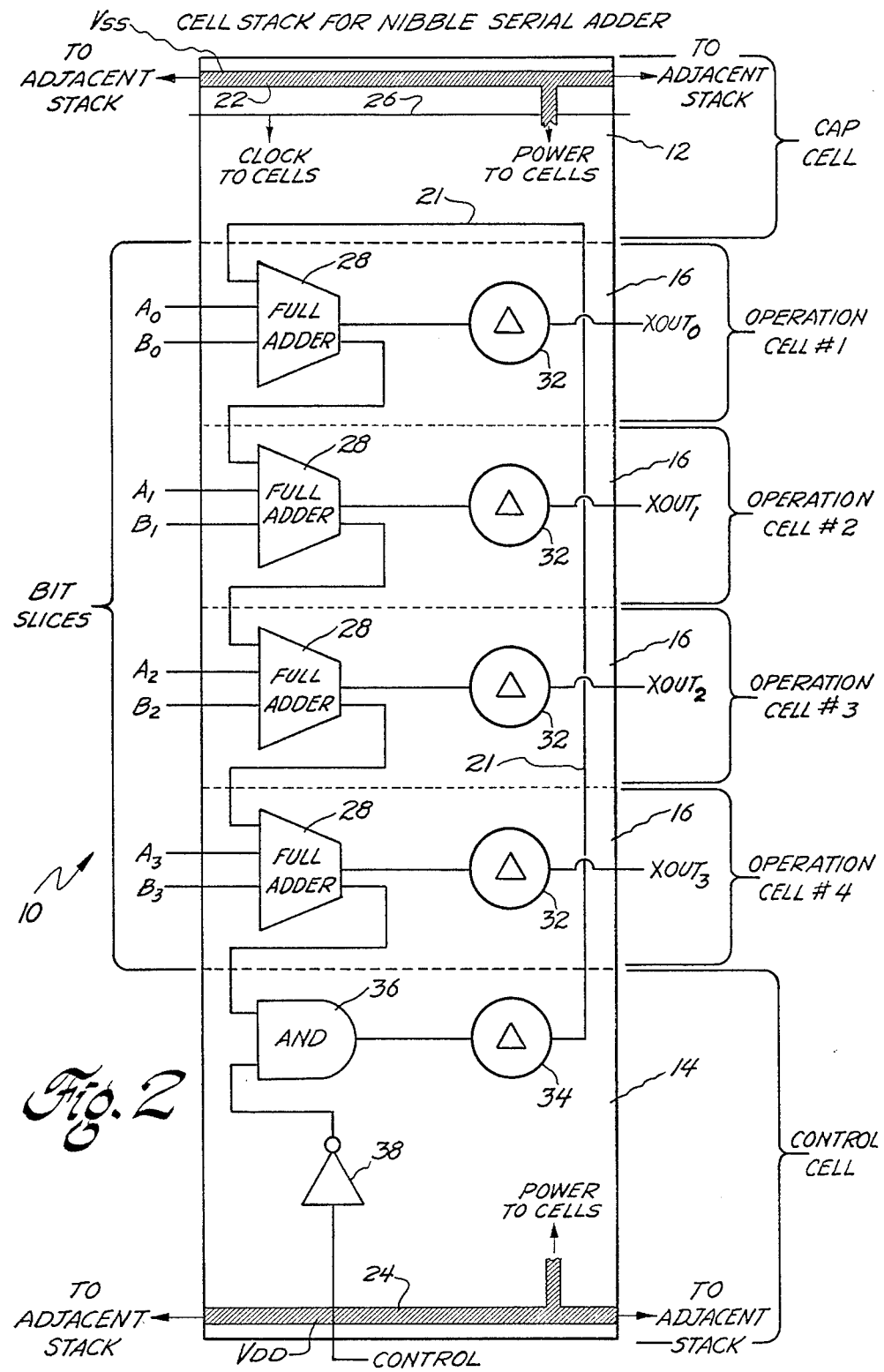
FIG. 2 is a block diagram view illustrating the architecture shown in FIG. 1 employed to implement a digit serial adder having a digit width of 4 bits.

A particular embodiment of the present invention is illustrated in FIG. 2. FIG. 2 illustrates, in block diagram form, a cell stack for a 4-bit digit serial adder. In particular, cap cell 12 is seen to contain power bus 22 which is configured to readily connect adjacent cell stacks and also to provide power to operation cells 16 and to control cell 14. Likewise, cap cell 12 includes clock line 26 which again is readily suppliable to adjacent cells and is operable to supply clock timing signals to each of operation cells 16. Control cell 14 is seen to include VDD power bus conductor 24 which is likewise readily connectable to adjacent cell stacks. Power bus 24 also supplies power, of the opposite polarity with respect to power bus 22, to operation cells 16.

In the particular embodiment shown, a 4-bit digit serial adder is described. In particular, each operation cell 16 includes full adder 28 receiving digit serial inputs $A_i$ and $B_i$. Here, i ranges from 0 to 3. The output of each full adder 28 is supplied to a delay block 32, the output of which provides digit serial output data to lines labeled $XOUT_0$ through $XOUT_3$, as shown. The carry-out signals from full adders 28 are supplied as inputs to the next higher significant bit. It is noted that each operation cell is the same. It is noted also that each operation cell individually performs a bit operation, but that collectively, these cells perform a 4-bit digit serial addition operation.

The digit serial adder shown in FIG. 2 also includes control cell 14 particularly configured to control the flow of carry information (at the digit level). In particular, it is seen that control cell 14 receives control signal information which is inverted by inverter 38 and supplied to AND gate 36 which also receives high order digit carry information from the full adder 28 which receives input signals $A_3$ and $B_3$. In operation, the control section supplies the carryout signal from the most significant bit of the digit, delays it one cycle through delay block 34 and returns it to the least significant digit bit in the next clock cycle. It resets it to zero if necessary. The carry signal into the low order digit bit position is reset to zero at the start of each data word. This reset operation is controlled by the special signal line labeled CONTROL in FIG. 2 which is high only in the last digit of each data word.

In general, data words are divided into a plurality of digits, each of size n. For example, if the word size is W and the digit size is n, there will, in general, be W/n passages of information through the adder cell stack to effect the addition of two words of W bits each. It is also noted that, in FIG. 2, carry signal 21, while shown disposed in the cell stack, may also be disposed in the routing channel between adjacently disposed cell stacks (see reference numeral 45 in the discussion of FIG. 3 below).

In FIG. 2, it is noted that data signals are supplied from the left and outputs are taken from the righthand side of the cell stack. However, it is noted that bit operation cells may be laid out in reverse fashion with data signals being directed to the left. In fact, it may be desirable to employ both kinds of cell stacks on the same chip. That is to say, on a given chip employing the present invention, data signals are not limited to flowing from either the left to the right or from the right to the left in a given cell stack. However, consistency in flow direction is generally advisable between adjacent disposed and connected cell stacks.

Figure 3:
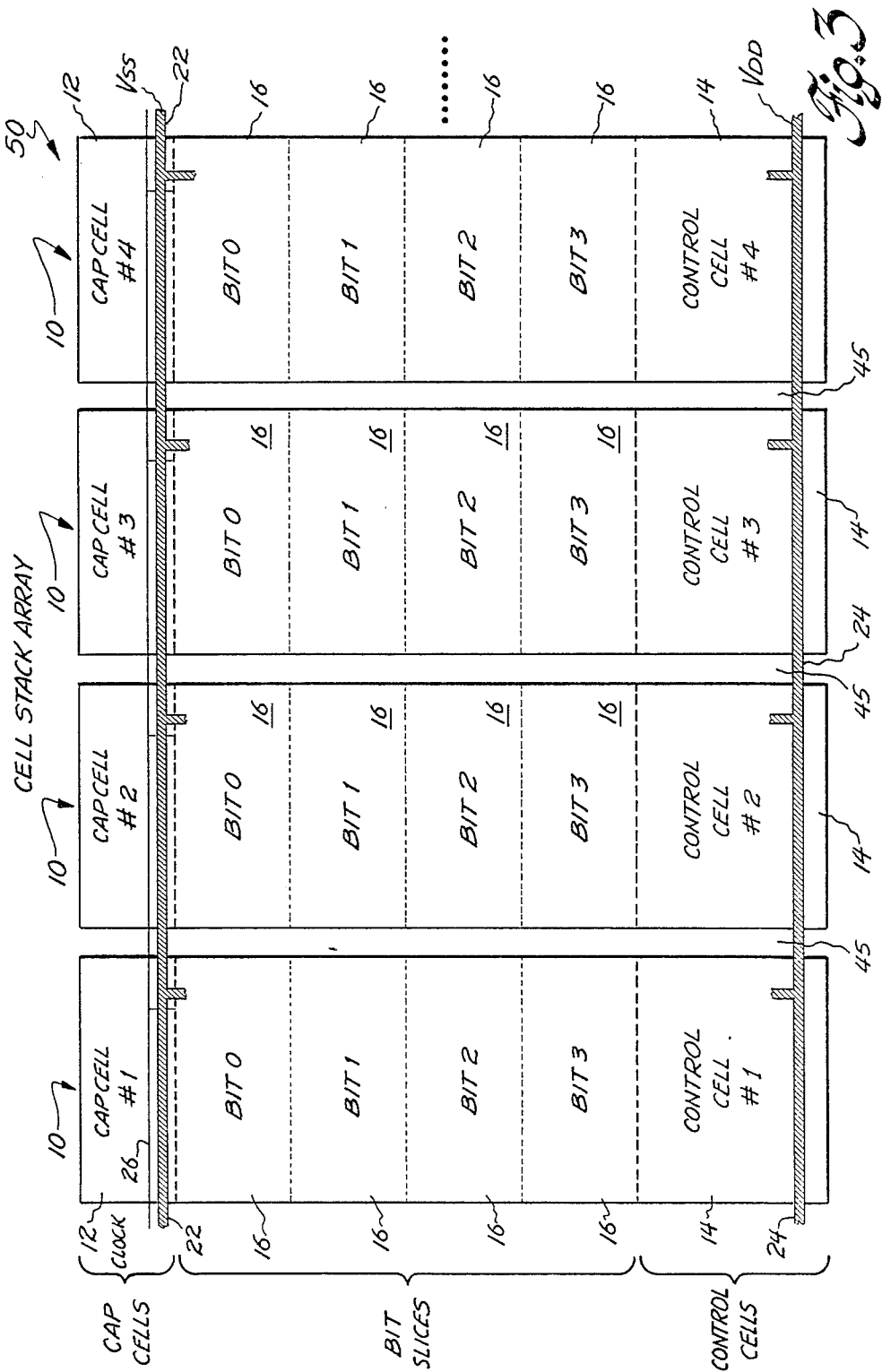
FIG. 3 is a block diagram illustrating an array of cell stacks connected in accordance with the present invention.

FIG. 3 illustrates a cell stack array 50 assembled from a plurality of cell stacks 10 in accordance with the present invention. FIG. 3 particularly illustrates some of the advantages of the present invention. In particular, different cell stacks 10 from a relatively small library of cell stack operators are seen to be readily configured in adjacent locations. It is seen that power busses 22 and 24 are readily connected between adjacent cell stacks 10. The same is true for the clock signal 26. Furthermore, clock signal line 26 is shown as being present in cap cell 12, it is noted that it also possible to dispose a clock signal line in control cell 14.

A particular advantage of the cell stack configuration of the present invention is that the cell library does not have to contain and maintain a large number of different cell stack operators for different digit sizes. The digit size is entirely controllable simply by changing the stack height and by including the appropriate number of bit slice operation cells 16. Thus, the configuration of the present invention provides an extremely flexible design without sacrificing layout efficiency.

It is noted that each of the cell stacks shown in array 50 in FIG. 3 may actually comprise different kinds of digit serial operators. Accordingly, the cell stacks are typically of varying widths even though a constant width is illustrated in FIG. 3. Nonetheless, the cell stack height is substantially constant. In those signal processing applications in which data may be passed directly from one operator stack to the next, it is possible to dispose the cell stacks in substantially abutting relationships. However, in those situations in which it is desirable to re-route signal or control signal lines between cell stacks, it is desirable to employ routing channel 45 which is disposed between adjacent cell stacks. For example, signal line 21 shown in FIG. 2 may in fact be disposed in one of these routing channels rather than being disposed within the operation cells. In this case, it is a matter of design choice which of the two locations for signal line 21 is selected. It is also noted that while the stacks are oriented vertically in FIG. 3, it is nonetheless possible to dispose adjacent stacks horizontally below one another.

Figure 4:
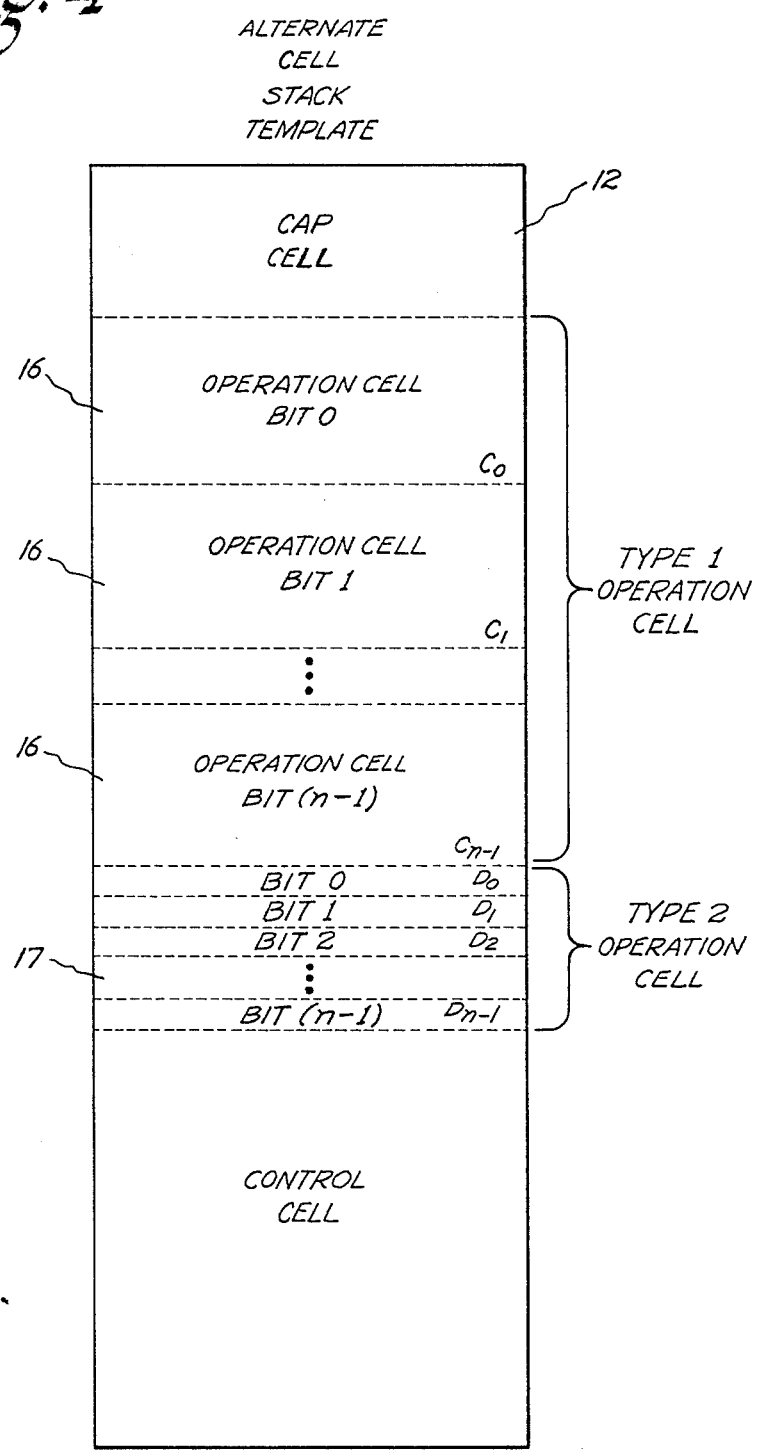
FIG. 4 is a block diagram similar to FIG. 1 except more particularly illustrating an alternative cell stack template in which each operation cell is divided into two distinct parts located in a different stack position.
Figure 5:
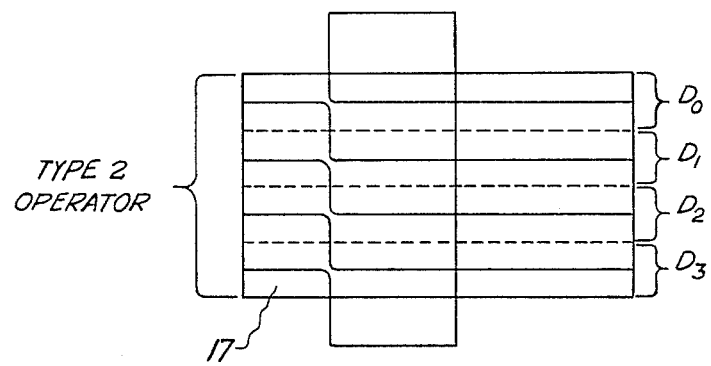
FIG. 5 is a schematic diagram illustrating an alternative stack design such as that shown in FIG. 4 and which is most particularly useful for carrying out signal routing in digit serial multiplication.

FIG. 4 illustrates an alternative cell stack template in accordance with the present invention. The template illustrated in block diagram form is similar to the template shown in FIG. 1 discussed above. However, the template illustrated in FIG. 4 is particularly applicable in those situations in which bit serial multiplication is performed. In particular, in FIG. 4, instead of having one operation cell per bit, two such cells $C_i$ (type 1) and $D_i$ (type 2) are employed. The cells $C_i$ and $D_i$ are disposed in the separate stack groups in different stack positions, as shown in FIG. 4. The cells $D_i$ form a stack group which performs an interleaving (rerouting) of signals (see FIG. 5), whereas cells $C_i$ (type 1) carry out single bit operations. This is done in such a way that the height $h_1$ of a bit slice of type 1 plus the height $h_2$ of a bit slice of type 2 equals the height H of an operator cell in the standard template; that is, $H = h_1 + h_2$. One particular configuration of these interleaving data line patterns is shown in FIG. 5. For example, in the construction of a multiplier for a pair of 12 bit data words, 12 cell stacks such as those shown in FIG. 4 may be employed and disposed in an adjacent relationship, as in FIG. 3, to perform a multiplication function. Routing of signals in the multiplication function is achieved by appropriately interleaving bit signal lines, as suggested in FIG. 5. Thus, it is possible in a cell stack to employ two types of operation cells (type 1 and type 2). Nonetheless, the stack height remains the same between adjacently disposed cell stacks. Only the original design is modified to increase the operation cell number to account for the presence of type 2 operation cell 17, such as that shown in FIGS. 4 and 5.

Figure 6:
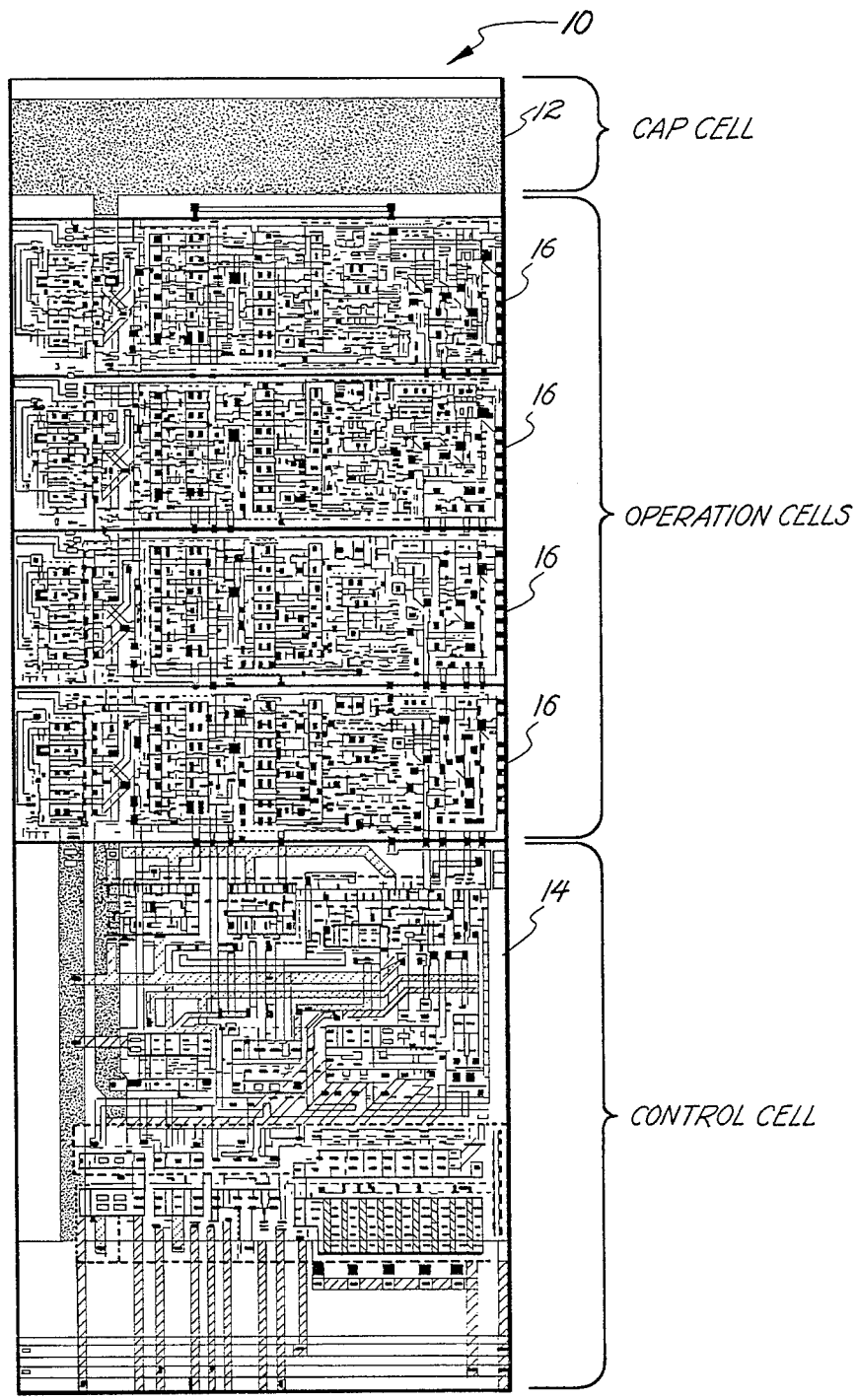
FIG. 6 is an approximate rendering of a cell stack in accordance with the present invention which is particularly useful for carrying out 4-bit serial addition operations.

FIG. 6 is illustrative of an actual cell stack employed to carry out 4-bit digit serial operations such as those illustrated in block diagram form in FIG. 2. It is noted, however, that FIG. 6 is illustrative only and, because of the scale and the detail present in the electrical circuitry shown, the resultant depiction is generally only suggestive of the connections, layouts and transistors present. In particular, the cell stack shown performs not only additions, but also subtraction, complementation and comparison operations. Nonetheless, cap cell 12, control cell 14 and operation cells 16 are clearly visible in the structure seen in FIG. 6.

Figure 7:
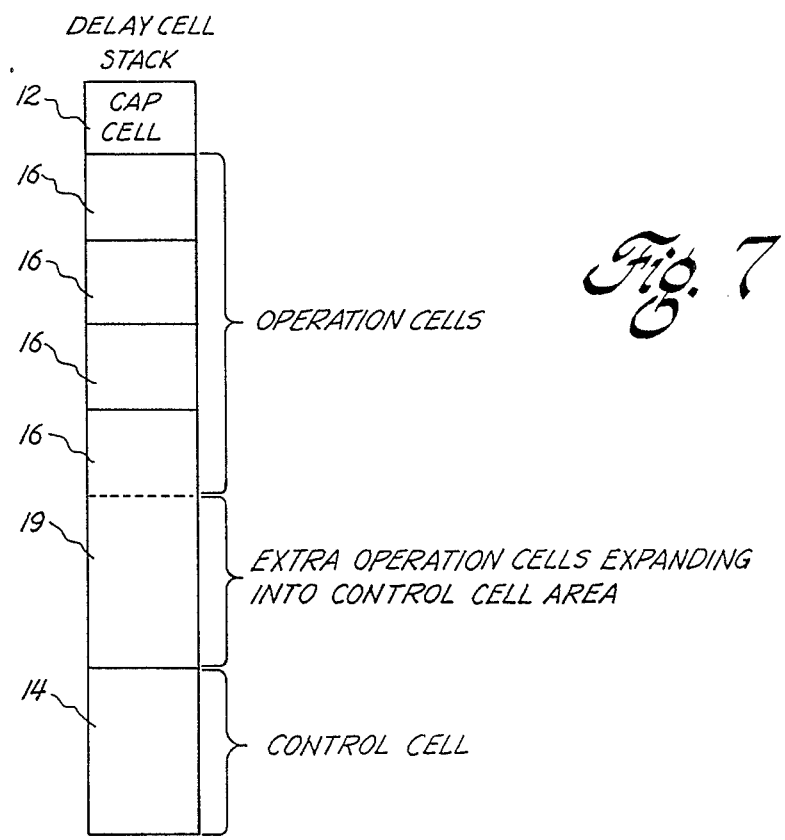
FIG. 7 is a block diagram illustrating a delay stack in which some of the control cell height has been given over to one or more operation cell functions.

FIG. 7 illustrates yet another embodiment of the present invention. In particular, FIG. 7 illustrates a cell stack template for a digit serial operator which implements a delay function. In this particular embodiment, a portion of control cell 14 is given over to extra operation cells which extend into the control cell area. This is desirable in the situation shown in which the cell stack operation is one of delay. However, in such circumstances, control cell circuitry is generally simple and does not require the full control cell area otherwise allocated.

The circuits produced from the basic cell stack library are largely self controlled. In general, all that is necessary is that each cell stack knows when each new data word begins. Since, because of latency, the beginning of the data word varies in time from cell stack to cell stack in the circuit, each cell stack must be notified at a different time at the beginning of the data word. In order to achieve this function, control on a chip is generally centralized in a MASTER CONTROLLER cell stack which is built from bit slices according to the standard template. The MASTER CONTROLLER cell stack accepts a single input called MASTER CONTROL which may be an input to the chip directly or else may be generated internally. This MASTER CONTROL signal is generally high for one clock cycle of each sample (usually in the most significant digit, but possibly in the least significant digit) and otherwise low. Also, some cells may receive more than one differently delayed control signal. The MASTER CONTROLLER stack itself produces delayed versions of this signal. The delayed versions are the same as the input except that the high cycle is shifted in time. The properly delayed MASTER CONTROL signal is now routed to each cell stack on the chip. If the word size is W and the digit size is n, then there are W/n distinct MASTER CONTROL signals because of the periodicity of this signal. In a typical incidence, W = 16 and n = 4. In this case, there will therefore be only 4 MASTER CONTROL signals being routed around the chip. Thus, the overhead in the circuit given over to centralized control is minimal.

It has been shown to be possible, following the cell stack architecture of the present invention, to construct libraries of cells which are easily assembled by software from a basic library of subcells, the cell stacks carry a full range of digit serial operators for arbitrary digit width. Digit widths greater than 16 are, however, generally not advisable because of the great cost of routing a circuit built from such cells. Variations on the basic template sometimes mean that cell stacks so constructed will not abut correctly with cell stacks which follow the standard template. However, this can be accommodated by corrective routing in the channels between adjacent cell stacks. The most important variation used is that instead of having a single operation cell per bit slice, each slice of an operator consists of two different cells, but still in such a way that the sum of the heights of the two subcells equals the height of a bit slice cell in a standard template. An example of this is the multiplier operator cell stack discussed above.

From the above, it is seen that the cell stack architecture of the present invention is particularly usable in conjunction with silicon compilers. More particularly, however, it is seen that the present invention provides such compilers with the ability to employ cell libraries comprising operator cell stacks for a variable number of digit sizes. This makes optimization of digit size possible. Thus, for a given chip size, it is now possible to be able to efficiently design and lay out digital signal processing circuitry which is not fully bit serial and is not fully parallel, but utilizes an optimal digit size. It is also seen that the present invention provides ease of layout and high efficiency in terms of chip area utilization. It is further seen that the variable width cell stacks of the present invention permits a silicon compiler to produce chip masks for optimum throughput circuitry for a given chip size by giving the operator a choice of digit size, a variable that has hitherto been unavailable for use in this fashion. It is further seen that the present invention fully carries out all of the objectives indicated above.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A cell stack for digit-serial digital circuit systems, said cell stack being located adjacent to a major plane surface of a monolithic integrated circuit die, having a width dimension and another dimension orthogonal thereto in the plane of said major plane surface, and comprising:

a cap cell having respective first and second opposed parallel sides, having respective third and fourth opposed parallel sides, and having between its said firs and second sides a width dimension substantially the same as said cell stack;

a control cell having respective first and second opposed parallel sides, having respective third and fourth opposed parallel sides, and having between its said first and second sides a width dimension substantially the same as said cell stack; and a plurality of operation cells, each of which is operable to carry out one or more single-bit operations, has respective first and second opposed parallel sides, has between its said first and second sides a width dimension substantially the same as said cell stack, has respective third and fourth opposed parallel sides, has its third side vis-a-vis with the fourth side of a respective one of said cap cell and the others of said operation cells, and has its fourth side vis-a-vis with the third side of a respective one of said control cell and the others of said operation cells;

said cap cell being configured to provide power from a first polarity supply to said operation cells and to provide a conductive path extending between its first and second sides and parallel with its third and fourth sides for connecting adjacently disposed cell stacks to said first polarity supply; and said control cell being configured to provide power from a second polarity supply to said operation cells and to provide a conductive path extending between its first and second sides and parallel with its third and fourth sides for connecting adjacently disposed cells stacks to said second polarity supply.

2. The cell stack of claim 1 in which said control cell includes control circuits powered by said first polarity supply and said second polarity supply.

3. The cell stack of claim 1 in which said control cell is operable to receive at least one control signal to control bit operations carried out by said operation cells.

4. The cell stack of claim 1 in which digital signal input connections are disposed on the first sides of said operation cells and digital signal output connections are disposed on the second sides of said operation cells.

5. The cell stack of claim 1 in which said operation cells are single bit serial adders.

6. The cell stack of claim 1 in which said operation cells are of a plurality of types, the third and fourth sides of each operation cell of a given type being separated by the same distance as the third and fourth sides of each other operation cell of that given type.

7. The cell stack of claim 6 in which the operation cells of each said type are contiguous with each other.

8. The cell stack of claim 1 in which each operation cell performs the same bit operation.

9. The cell stack of claim 1 further including means for supplying a clock signal to adjacently disposed cell stacks.

10. The cell stack of claim 9 in which said clock signal supply means is disposed in said cap cell.

11. The cell stack of claim 9 in which said clock signal supply means is disposed in said control cell.

12. Two cell stacks for digit-serial digital circuit systems, said two cell stacks respectively identified by the ordinal numbers first and second, each said cell stack being located adjacent to a major plane surface of a monolithic integrated circuit die, having a width dimension and another dimension orthogonal thereto in the plane of said major plane surface, and comprising:

a cap cell having respective first and second opposed parallel sides, having respective third and fourth opposed parallel sides, and having between its said first and second sides a width dimension substantially the same as said cell stack;

a control cell having respective first and second opposed parallel sides, having respective third and fourth opposed parallel sides, and having between its said first and second sides a width dimension substantially the same as said cell stack; and a plurality of operation cells, each of which is operable to carry out one or more single-bit operations, has respective first and second opposed parallel sides, has digital signal input connections disposed along its said firs side, has digital signal output connections disposed along its said second side, has between its said first and second sides a width dimension substantially the same as said cell stack, has respective third and fourth opposed parallel sides, has its third side vis-a-vis with the fourth side of a respective one of said cap cell and the others of said operation cells, and has its fourth side vis-a-vis with the third side of a respective one of said control cell and the others of said operation cells;

electrical conductors within said cap cell, which conductors are configured to provide power from a first polarity supply to said operation cells and to provide a conductive path extending between its first and second sides and parallel with its third and fourth sides for connecting adjacently disposed cell stacks to said first polarity supply; and electrical conductors within said control cell, which conductors are configured to provide power from a second polarity supply to said operation cells and to provide a conductive path extending between its first and second sides and parallel with its third and fourth sides for connecting adjacently disposed cell stacks, the second sides of the operation cells of said first cell stack being vis-a-vis with the first sides of corresponding operation cells of said second cell stack respectively the second side of the cap cell of said first cell stack being vis-a-vis with the first side of the cap cell of said second cell stack, and the second side of the control cell of said first cell stack being vis-a-vis with the first side of the control cell of said second cell stack, said first and second cell stacks being connected to form at least a portion of an array of cell stacks by means including:

a series electrical connection of the conductive paths through said cap cells;

a series electrical connection of the conductive paths through said control cells; and a respective connection of the digital signal output connection of each operation cell in said first stack to the digital signal input connection of its said corresponding operation cell in sad second stack.

13. The array of claim 12 in which each cell stack possesses the same number of operation cells.

14. The array of claim 12 in which said cap cells are each of the same dimension between its third and fourth sides and said control cells are each of the same dimension between its third and fourth sides.

15. The array of claim 12 in which said first and second cell stacks are disposed in a spaced apart relationship so as to define a channel therebetween for routing interconnection conductors.

16. Two cell stacks in combination as set forth in claim 12 wherein the third and fourth sides of each of their operation cells are separated by a standard dimension orthogonal to its width dimension.

* * * * *